United States Patent
Gruddanti et al.

(10) Patent No.: US 12,417,792 B2
(45) Date of Patent: Sep. 16, 2025

(54) JITTER REDUCTION IN MIXED-SIGNAL PROCESSING CIRCUITS

(71) Applicant: Advanced Micro Devices, Inc., Santa Clara, CA (US)

(72) Inventors: Srikanth Reddy Gruddanti, Bangalore (IN); Prasant Kumar Vallur, Telangana (IN); David Da-Wei Lin, Westborough, MA (US); Manoj N Kulkarni, Bangalore (IN); Priyadarshi Saxena, Bangalore (IN)

(73) Assignee: Advanced Micro Devices, Inc., Santa Clara, CA (US)

( * ) Notice: Subject to any disclaimer, the term of this patent is extended or adjusted under 35 U.S.C. 154(b) by 315 days.

(21) Appl. No.: 18/201,611

(22) Filed: May 24, 2023

(65) Prior Publication Data

US 2024/0395295 A1 Nov. 28, 2024

(51) Int. Cl.
*G11C 7/22* (2006.01)
*G11C 7/10* (2006.01)
*H03K 19/003* (2006.01)

(52) U.S. Cl.
CPC ............ *G11C 7/222* (2013.01); *G11C 7/1048* (2013.01); *H03K 19/00361* (2013.01)

(58) Field of Classification Search
CPC .................................. G11C 7/222; G11C 7/22

USPC ..................................................... 365/233.1
See application file for complete search history.

(56) References Cited

U.S. PATENT DOCUMENTS

| 7,403,053 B2 * | 7/2008 | Casper | H04L 7/0008 |
| | | | 327/158 |
| 11,626,885 B1 * | 4/2023 | Liu | H03M 3/426 |
| | | | 341/143 |

OTHER PUBLICATIONS

DDR5 SDRAM, JEDEC Standard JESD79-5, Jul. 2020; Section 4.30, Decision Feedback Estimation; Jedec Olid State Technology Association, 3103 North 10th Street, Suite 240, South Arlington, VA 22201-2107; 3 pages.*
"DDR5 SDRAM", JEDEC Standard JESD79-5, Jul. 2020; Section 4.30, Decision Feedback Estimation; JEDEC Solid State Technology Association, 3103 North 10th Street, Suite 240, South Arlington, VA 22201-2107; 33 pages.

* cited by examiner

*Primary Examiner* — Muna A Techane
(74) *Attorney, Agent, or Firm* — Polansky & Associates, P.L.L.C.; Paul J. Polansky

(57) ABSTRACT

A signal processing circuit includes an analog front-end circuit and a digital delay circuit. The analog circuit receives a clock signal and provides a compensated clock signal. The digital delay circuit is coupled to the analog front-end circuit and provides a compensated sample clock signal in response to delaying the compensated clock signal. The analog circuit measures a variation of a power supply voltage and adjusts a gain through the analog circuit according to a measured variation of the power supply voltage.

20 Claims, 7 Drawing Sheets

JITTER REDUCTION IN MIXED-SIGNAL PROCESSING CIRCUITS

FIELD

This disclosure relates generally to signal processing circuits, and more specifically to jitter reduction in mixed-signal processing circuits.

BACKGROUND

Noise in power supplies can affect signal transmission integrity in signal processing systems. For example, source synchronous clocking is a data transmission technique in which a source circuit generates and sends a clock signal along with a data signal, and a destination circuit uses the received clock signal to capture the data. Source synchronous clock forwarding input-output architectures include double data rate (DDR) dynamic random access memory (DRAM), low power DDR (LPDDR) DRAM, graphics DDR (GDDR) DRAM, and high bandwidth memory (HBM), as well as many other data transmission systems. For example, DDR5 memory uses data (DQ) and data strobe (DQS) signals for source-synchronous transmission during read and write transactions. On a write cycle, a host processor sends DQ signals and captures them on both edges of a data strobe signal (DQS). On a read cycle, the DDR5 memory sends DQ signals aligned on both edges of a data strobe signal (DQS). The host processor performs training to delay the launch of the data signal during writes so that the data arrives at the memory centered around each DQS transition, and performs training to internally delay the data signal during reads so that the data signal will be centered around each DQS transition. During reads and writes, the capturing device has a period of time defined by the "data eye" in which it can reliably capture data. As DDR memory transmission speeds have increased, and can be as high as five Gigahertz (GHz) and higher, data eye closure has become a significant problem.

One technique is to provide a receiver with continuous time linear equalization (CTLE). A typical receiver using this technique has a DQS path through an analog front end receiver with CTLE equalization, followed by programmable delay line, and then a distribution network that distributes the DQS signal to sample DQ signals on all data lanes, but this technique adds mismatch between the DQ and DQS paths.

Since DQ and DQS paths are not matched, the mismatch creates relative jitter between DQ and DQS at the input of a sampler. Moreover, this jitter is dominated by un-correlated power supply noise caused by transmission of the DQ and DQS signals formed using the senders power supply, and reception of the DQS signal in an analog front-end circuit using another power supply with uncorrelated noise. The result is that unmatched power supply-induced jitter (PSIJ) can be as large as the width of the data eye itself, preventing reliable data reception. This problem is more difficult at current data rates that can be as large as 5 Gigabits per second (Gbps) and above.

Figure 1:
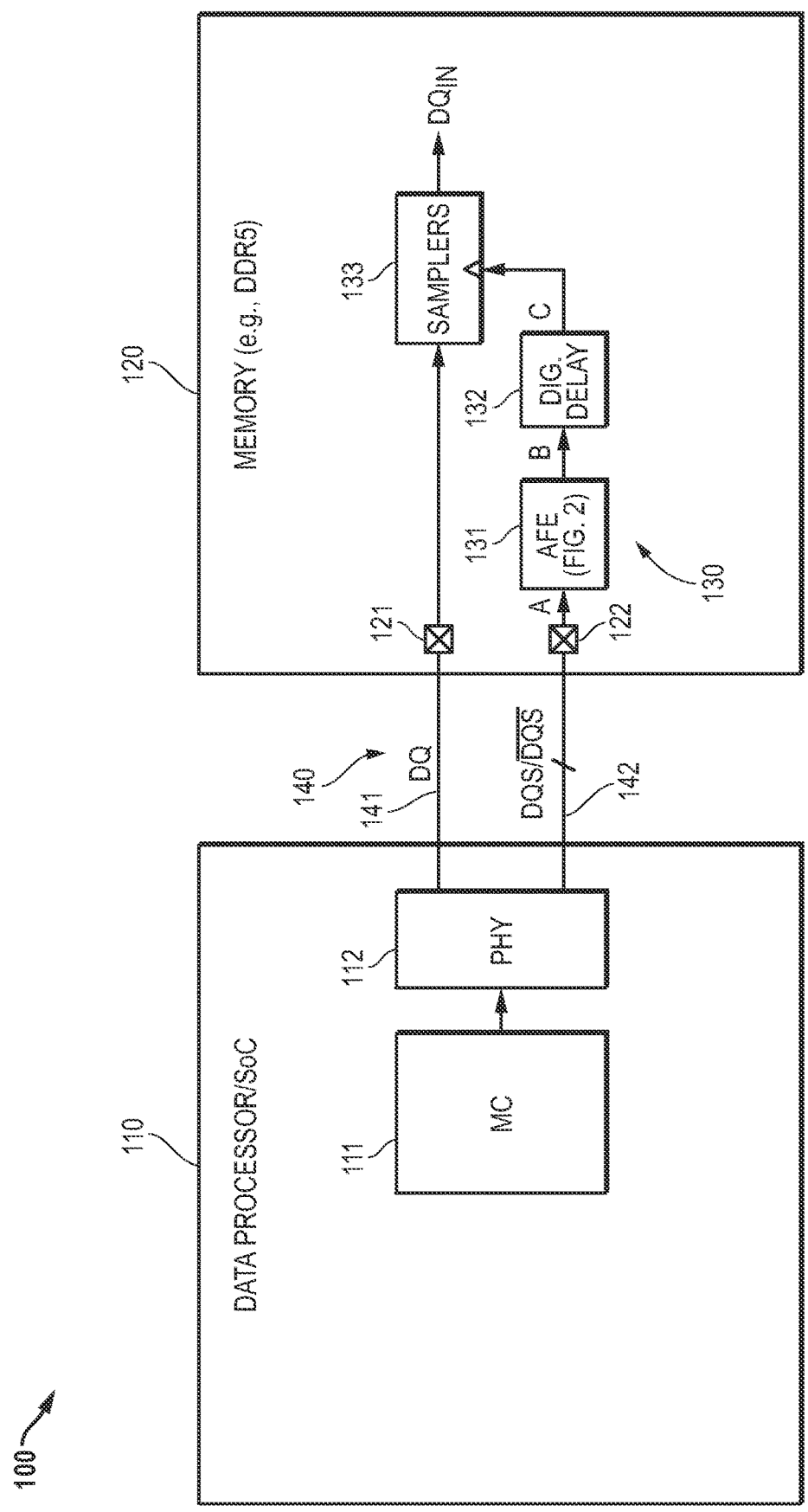
FIG. 1 illustrates in block diagram form an exemplary data processing system that performs jitter reduction for signal processing circuits according to some embodiments.

In the following description, the use of the same reference numerals in different drawings indicates similar or identical items. Unless otherwise noted, the word "coupled" and its associated verb forms include both direct connection and indirect electrical connection by means known in the art, and unless otherwise noted any description of direct connection implies alternate embodiments using suitable forms of indirect electrical connection as well. The following Detailed Description is directed to electronic circuitry, and the description of a block shown in a drawing figure implies the implementation of the described function using suitable electronic circuitry, unless otherwise noted.

DETAILED DESCRIPTION OF ILLUSTRATIVE EMBODIMENTS

A signal processing circuit includes an analog circuit and a digital delay circuit. The analog circuit receives a clock signal and provides a compensated clock signal. The digital delay circuit is coupled to the analog circuit and provides a compensated sample clock signal in response to delaying the compensated clock signal. The analog circuit measures a variation of a power supply voltage and adjusts a gain through the analog circuit according to a measured variation of the power supply voltage.

A data processing system includes a data processor and a memory. The data processor has a memory controller and a physical interface circuit coupled to the memory controller. The memory is coupled to the physical interface circuit over a memory bus. The memory bus conducts a data signal with a corresponding source-synchronous clock signal. At least one of the physical interface circuit and the memory includes a signal processing circuit. The signal processing circuit includes an analog circuit and a digital delay circuit. The analog circuit receives a clock signal and provides a compensated clock signal. The digital delay circuit is coupled to the analog circuit and provides a compensated sample clock signal in response to delaying the compensated clock signal. The analog circuit measures a variation of a power supply voltage and adjusts a gain through the analog circuit according to a measured variation of the power supply voltage.

A method for compensation for power supply induced jitter of a clock signal in a signal processing circuit includes receiving the clock signal and providing a compensated clock signal in response to receiving the clock signal by an analog circuit. A compensated sample clock signal is provided in response to delaying the compensated clock signal. A data signal is sampled in response to an edge of the compensated sample clock signal. A variation of a power supply voltage used by the source-synchronous clock system is measured. A gain used in providing the compensated sample clock signal is adjusted in an amount proportional to a measured variation of the power supply voltage.

FIG. 1 illustrates in block diagram form an exemplary data processing system 100 that performs jitter reduction for signal processing circuits according to some embodiments. Data processing system 100 includes generally a data processor 110 and a memory 120 connected to data processor 110 over a memory bus 140.

In some embodiments, data processor 110 is implemented as a microprocessor with one or more data processor cores. In some embodiments, data processor 110 is implemented as a system-on-chip (SoC) having multiple data processor cores, on-chip memory, and on-chip peripheral interfaces. Data processor 110 includes a memory controller 111 labelled "MC", and a physical interface circuit 112 labelled "PHY" that is connected to memory controller 111 and conducts various signals over memory bus 140. Shown in FIG. 1 are two signals of interest used in source-synchronous data transmission and reception, including a data bus conducting data signals labelled generically "DQ" over a set of conductors 141, and true and complement data strobe signals labelled "DQS" and "$\overline{\text{DQS}}$", respectively, over a set of conductors 142.

Memory 120 includes a first set of integrated circuit terminals 121 for the DQ signals, and a second set of integrated circuit terminals 122 for the DQS and $\overline{\text{DQS}}$ signals. Memory 120 also includes a signal processing circuit 130 having an analog circuit 131 labelled "AFE", a digital delay circuit 132, and a sampling circuit 133. Analog circuit 131 has an input connected to integrated circuit terminals 122 at nodes labelled "A", and an output at nodes labelled "B". Digital delay circuit 132 has an input connected to the output of analog circuit 131, and an output at nodes labelled "C". Samplers 133 have inputs connected to first set of integrated circuit terminals 121, a capture input connected to the output of digital delay circuit 132, and an output for providing a set of sampled data signals generically labelled "$DQ_{IN}$".

In DDR memory systems, data is transmitted bidirectionally. During a read cycle, the memory transmits both the DQ signals and the DQS/$\overline{\text{DQS}}$ signals in a source-synchronous manner. During a write cycle, the data processor transmits the DQ signals and the DQS/$\overline{\text{DQS}}$ signals to the memory in a source-synchronous manner. Preferably, both data processor 110 and memory 120 use the jitter reduction technique and circuitry described herein when receiving data. However, either side can use it advantageously, and in data processing system 100, the jitter reduction circuit is shown on the memory side only.

Generally, analog circuit 131 operates as an analog front-end in a DQS receive path. It receives the DQS and $\overline{\text{DQS}}$ signals and compensates for a measured variation in power supply voltage by adjusting its gain using feed-forward gain modulation. The received clock signal, in this case data strobe signals DQS and $\overline{\text{DQS}}$, goes through a digital delay, and compensation is performed for the whole path that is affected by power supply insertion jitter between nodes A and C by overcompensating for the measured delay. The result is less jitter is better data transmission reliability from a larger data eye, and the capability of acceptable data transmission quality at higher data transmission speeds.

Figure 2:
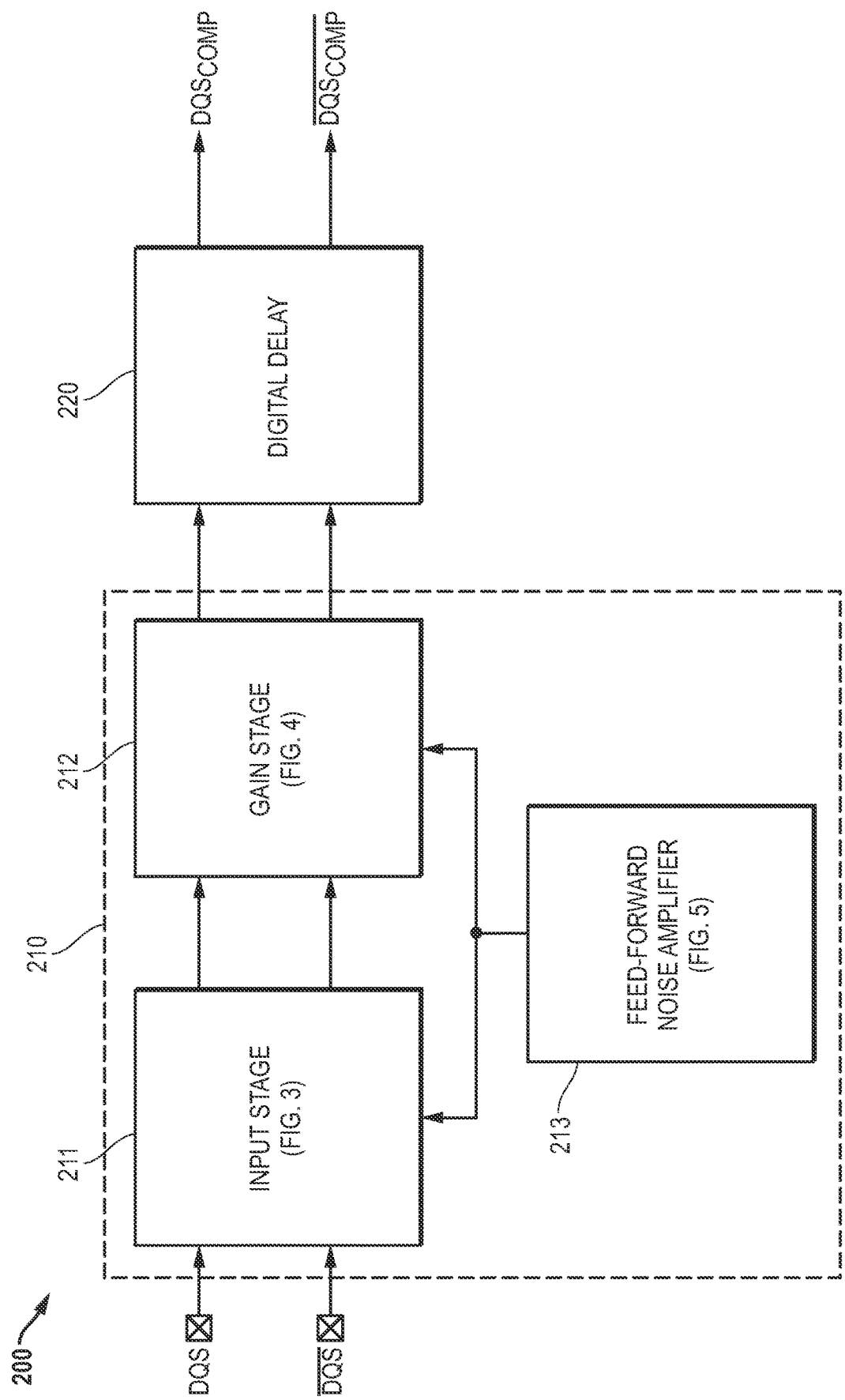
FIG. 2 illustrates in block diagram a signal processing circuit suitable for use in a source-synchronous clocking system according to some embodiments.

FIG. 2 illustrates in block diagram a signal processing circuit 200 suitable for use in a source-synchronous clocking system according to some embodiments. Signal processing circuit 200 includes an analog circuit 210 and a digital delay circuit 220. Analog circuit 210 includes an input stage 211, a gain stage 212, and a feed-forward noise amplifier 213. Input stage 211 has inputs for receiving a differential data strobe signal including a first input for receiving the DQS signal and a second input for receiving the $\overline{\text{DQS}}$ signal, a control input for receiving a gain adjustment signal, and a differential output. Gain stage 212 has a differential input connected to the differential output of input stage 211, a control input for receiving the gain adjustment signal, and a differential output. Feed-forward noise amplifier 213 has a power supply input for receiving the power supply voltage (not shown), and an output for providing the gain adjustment signal to the control input of input stage 211 and gain stage 212. Digital delay circuit 220 has a differential input coupled to the differential output of gain stage 212, and a differential output for providing the compensated clock signal as a differential signal including a true component $DQS_{COMP}$, and a complementary component $\overline{DQS_{COMP}}$. Note that the data strobe signals clock data during a read or write cycle, and are considered clock signals even though they cease switching during inactive periods.

Each of the circuits in signal processing circuit 200 has a power supply terminal for receiving a power supply voltage labelled "$V_{DDQ}$" and a ground terminal for receiving a ground voltage labelled "$V_{SSQ}$", and forms a power supply voltage similarly referred to as $V_{DDQ}$ when $V_{SSQ}$ is at zero volts. Variations in the power supply voltage resulting from noise cause power supply induced jitter (PSU) on DQS and $\overline{\text{DQS}}$. Feed-forward noise amplifier 213 compensates for this jitter by providing the gain adjustment signal. Moreover, in some embodiments, the gain adjustment signal overcompensates for the measured noise in order to compensate for additional PSU caused by digital delay circuit 230, which also receives $V_{DDQ}$. In some embodiments, the amount of overcompensation is calculated according to a measured or characterized ratio of analog delay to digital delay. In some embodiments, the overcompensation ratio can be determined by using the measured power supply voltage level to index into a lookup table with predetermined overcompensation ratios.

The construction and operation of exemplary circuits that can be used for input stage 211, gain stage 212, and feed-forward noise amplifier 213 will now be explained with reference to exemplary circuits.

Figure 3:
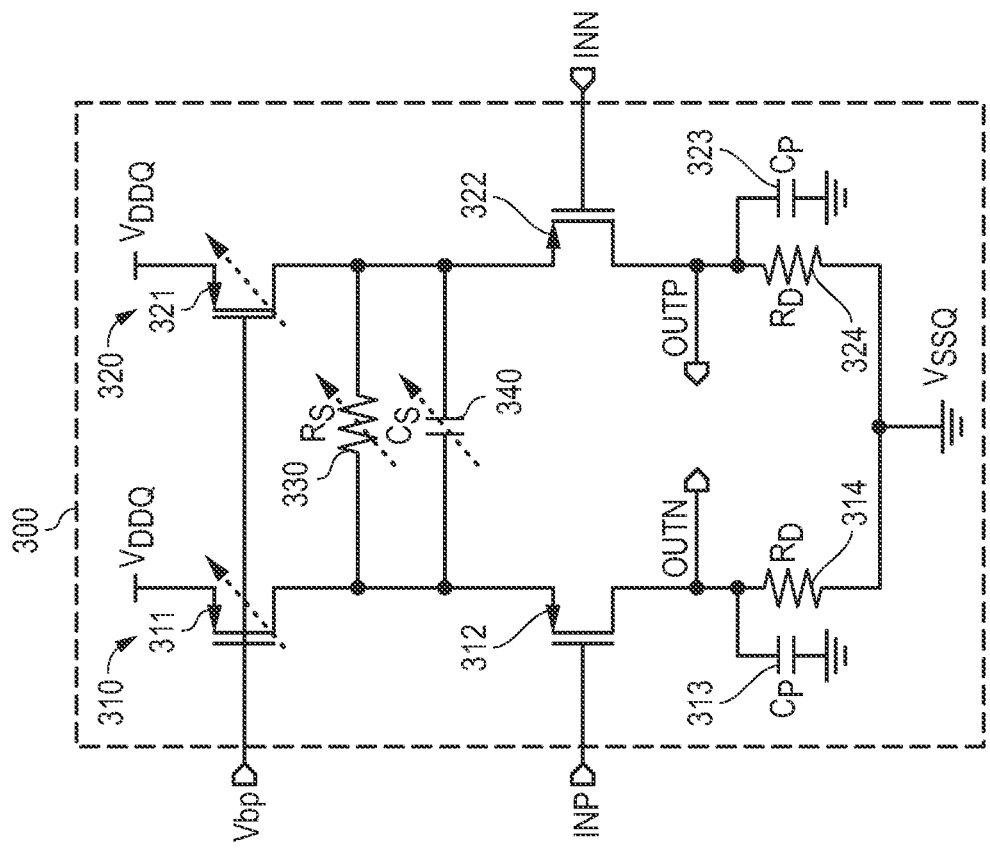
FIG. 3 illustrates in schematic form an input stage suitable for use as the input stage of FIG. 1 according to some embodiments.

FIG. 3 illustrates in schematic form an input circuit 300 suitable for use as input stage 211 of FIG. 2 according to some embodiments. Input circuit 300 includes a first current path 310, a second current path 320, a resistor 330, and a capacitor 340.

First current path 310 includes transistors 311 and 312, a capacitor 313, and a resistor 314. Transistor 311 is a P-channel metal-oxide-semiconductor (MOS) transistor having a source connected to $V_{DDQ}$, a gate for receiving a bias signal labelled "Vbp", a drain, and a feedback input. Transistor 312 is a P-channel MOS transistor having a source connected to the drain of transistor 311, a gate for receiving a true input signal labelled "INP", and a drain for providing a complement output signal labelled "OUTN", and a feedback input. Capacitor 313 has a first terminal connected to the drain of transistor 312, and a second terminal connected to $V_{SSQ}$, and has an associated capacitance labelled "$C_P$". Resistor 314 is a variable resistor having a first terminal connected to the drain of transistor 312, a second terminal connected to $V_{SSQ}$, a feedback input, and has an associated resistance labelled "$R_D$".

Second current path 320 includes transistors 321 and 322, a capacitor 323, and a resistor 324. Transistor 321 is a P-channel MOS transistor having a source connected to $V_{DDQ}$, a gate for receiving the Vbp signal, and a drain. Transistor 322 a P-channel MOS transistor having a source connected to the drain of transistor 321, a gate for receiving a complement input signal labelled "INN", and a drain for providing a true output signal labelled "OUTP". Capacitor 323 has a first terminal connected to the drain of transistor 322, a second terminal connected to $V_{SSQ}$, and has an associated capacitance $C_P$. Resistor 324 is a variable resistor having a first terminal connected to the drain of transistor 322, a second terminal connected to $V_{SSQ}$, a feedback input, and has an associated resistance $R_D$.

Resistor 330 is a variable resistor having a first terminal connected to the source of transistor 311, a second terminal connected to the source of transistor 321, and a feedback input. Capacitor 340 has a first terminal connected to the source of transistor 311, a second terminal connected to the source of transistor 321, and a tuning input.

Input circuit 300 uses CTLE to adjust the effective widths of transistors 311 and 321 and the values of resistors 314, 324, and 330. Vbp is a bias signal for P-channel MOS transistors that sets the gain of input circuit 300. When input circuit 300 is used as input stage 211, Vbp receives the control signal from feed-forward noise amplifier 213 of FIG. 2, the INP and INN terminals receive the DQS and $\overline{DQS}$ signals, respectively, and the OUTP and OUTN signals are output signals provided to gain stage 212.

Figure 4:
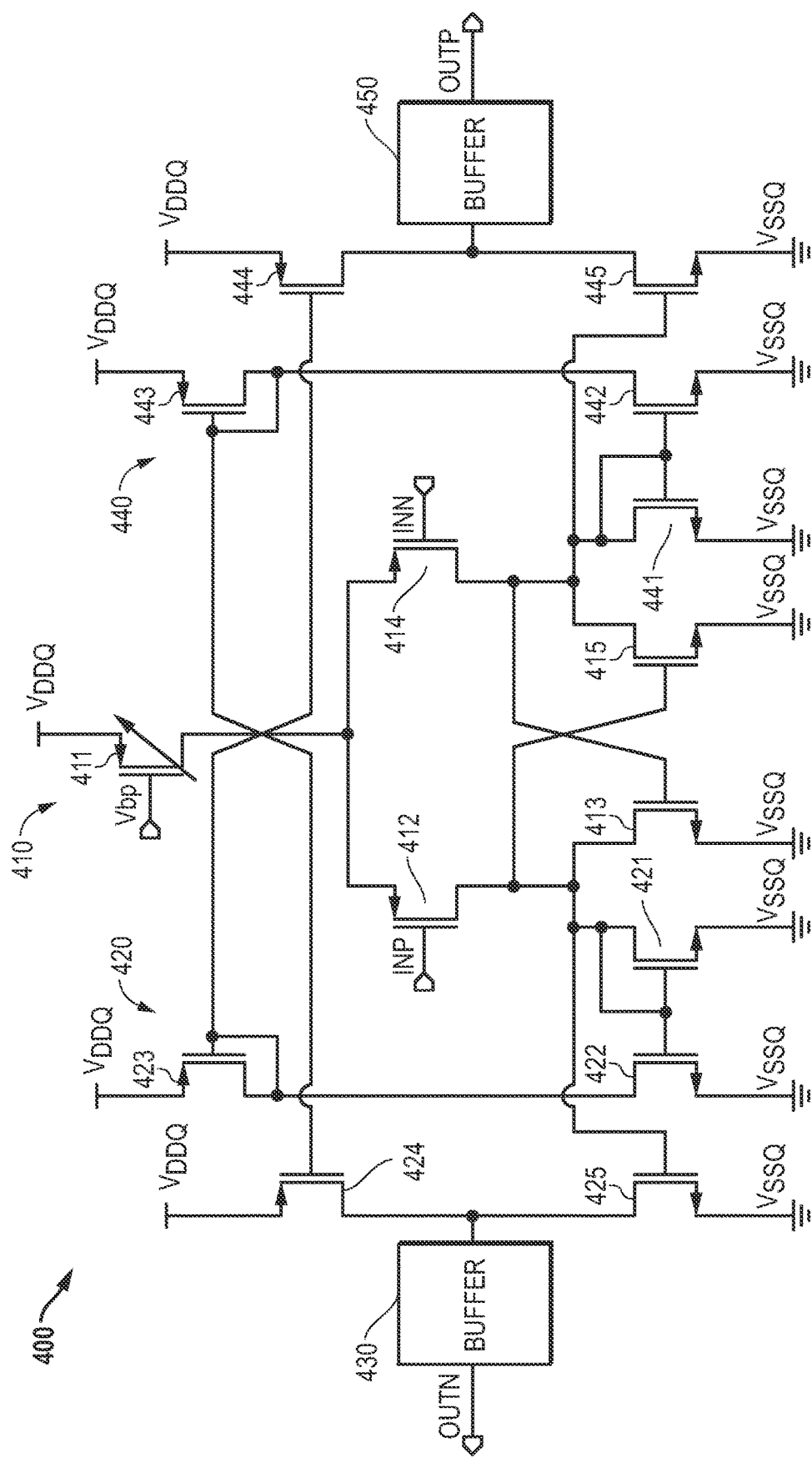
FIG. 4 illustrates in partial block diagram and partial schematic form a gain stage suitable for use as the gain stage of FIG. 2 according to some embodiments.

FIG. 4 illustrates in partial block diagram and partial schematic form a gain stage 400 suitable for use as gain stage 212 of FIG. 2 according to some embodiments. Gain stage 400 includes generally an input portion 410, a true current mirror portion 420, a buffer 430, a complement current mirror portion 440, and a buffer 450.

Input portion 410 includes transistors 411-415. Transistor 411 is a P-channel MOS transistor having source connected to $V_{DDQ}$, a gate for receiving the Vbp signal, a drain, and a feedback input used for CTLE. Transistor 412 is a P-channel MOS transistor having source connected to the drain of transistor 411, a gate forming the positive input terminal receiving signal INP, and a drain. Transistor 413 is an N-channel MOS transistor having drain connected to the drain of transistor 412, a gate, and a source connected to $V_{SSQ}$. Transistor 414 is a P-channel MOS transistor having source connected to the drain of transistor 411, a gate forming the negative input terminal receiving signal INN, and a drain connected to the gate of transistor 413. Transistor 415 is an N-channel MOS transistor having drain connected to the drain of transistor 414, a gate connected to the drain of transistor 412, and a source connected to $V_{SSQ}$.

True current mirror portion 420 includes transistors 421-425. Transistor 421 is an N-channel transistor having a drain connected to the drain of transistor 412, a gate connected to the drain thereof, and a source connected to $V_{SSQ}$. Transistor 422 is an N-channel transistor having a drain, a gate connected to the drain of transistor 421, and a source connected to $V_{SSQ}$. Transistor 423 is a P-channel transistor having a source connected to $V_{DDQ}$, a gate, and a drain connected to the drain of transistor 422 and to the gate thereof. Transistor 424 is a P-channel transistor having a source connected to $V_{DDQ}$, a gate, and a drain. Transistor 425 is an N-channel transistor having a drain connected to the drain of transistor 424, a gate connected to the drain of transistor 412, and a source connected to $V_{SSQ}$.

Buffer 430 has an input connected to the drains of transistors 424 and 425, and an output forming the complement output signal OUTN.

Complement current mirror portion 440 includes transistors 441-445. Transistor 441 is an N-channel transistor having a drain connected to the drain of transistor 414, a gate connected to the drain thereof, and a source connected to $V_{SSQ}$. Transistor 442 is an N-channel transistor having a drain, a gate connected to the drain of transistor 441, and a source connected to $V_{SSQ}$. Transistor 443 is a P-channel transistor having a source connected to $V_{DDQ}$, a gate, and a drain connected to the drain of transistor 422 and to the gate thereof and to the gate of transistor 424. Transistor 444 is a P-channel transistor having a source connected to $V_{DDQ}$, a gate connected to the drain of transistor 423, and a drain. Transistor 445 is an N-channel transistor having a drain connected to the drain of transistor 444, a gate connected to the drain of transistor 414, and a source connected to $V_{SSQ}$.

Buffer 450 has an input connected to the drains of transistors 444 and 445, and an output forming the true output signal OUTP.

When used as gain stage 212 of FIG. 1, gain stage 400 receives the output of input stage 211 and provides a low impedance output capable of driving a significantly larger load. Transistor 411 operates as a current source when biased by signal Vbp. Transistors 412 and 414 operate as a differential pair that selectively divert the current from this current source based on the difference in voltage between the INP and INN terminals. When used with input stage 211, INP and INN are connected to the OUTP and OUTN outputs of input stage 211, and OUTP and OUTN are connected to digital delay circuit 220.

Figure 5:
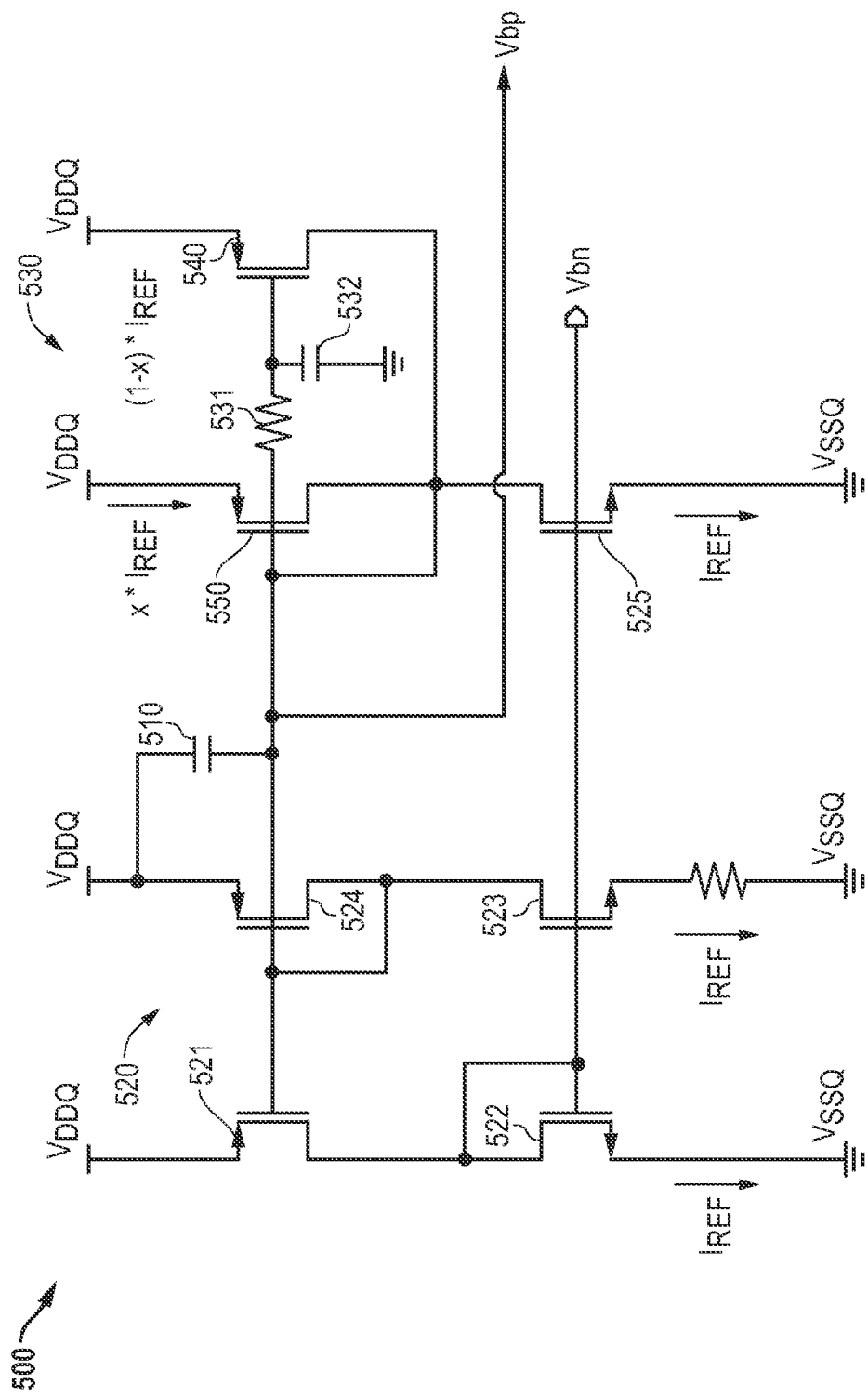
FIG. 5 illustrates in schematic form a feed-forward noise amplifier suitable for use as the feed-forward noise amplifier of FIG. 2 according to some embodiments.

FIG. 5 illustrates in schematic form a feed-forward noise amplifier 500 suitable for use as feed-forward noise amplifier 213 of FIG. 2 according to some embodiments. Feed-forward noise amplifier 500 includes a capacitor 510, a reference current generator 520, a lowpass filter 530, a transistor 540, and a transistor 550.

Capacitor 510 has a first terminal connected to $V_{DDQ}$, and a second terminal forming bias signal Vbp. Reference current generator 520 includes transistors 521-525. Transistor 521 is a P-channel MOS transistor having a source connected to $V_{DDQ}$, a gate connected to the second terminal of capacitor 510, and a drain. Transistor 522 is an N-channel MOS transistor having a drain connected to the drain of transistor 521, a gate connected to the drain thereof, and a source connected to $V_{SSQ}$. Transistor 523 is an N-channel MOS transistor having a drain, a gate connected to the drain of transistor 522, and a source connected to $V_{SSQ}$. Transistor 524 is a P-channel MOS transistor having a source connected to $V_{DDQ}$, a gate, and a drain connected to the gates of transistors 521 and 524. Transistor 525 is an N-channel MOS transistor having a drain connected to the second terminal of capacitor 510, a gate connected to the drain of transistor 522, and a source connected to $V_{SSQ}$. Lowpass filter 530 includes a resistor 531 and a capacitor 532. Resistor 531 has a first terminal connected to the second terminal of capacitor 510, and a second terminal. Capacitor 522 has a first terminal connected to the second terminal of resistor 531, and a second terminal connected to $V_{SSQ}$. Transistor 540 is a P-channel MOS transistor having a source connected to $V_{DDQ}$, a gate connected to the first terminal of capacitor 532, and a drain connected to the second terminal of capacitor 510, and operates as a transconductance amplifier. Transistor 550 is a P-channel MOS transistor having a source connected to $V_{DDQ}$, a gate connected to the second terminal of capacitor 510, and a drain connected to the second terminal of capacitor 510, and operates as a transconductance amplifier.

In general, feed-forward noise amplifier 500 forms bias signals for P- and N-channel transistors, namely Vbp and Vbn, respectively. These bias signals include a gain adjustment component to compensate the gain for variations in power supply voltage $V_{DDQ}$ with respect to ground voltage $V_{SSQ}$. Feed-forward noise amplifier 500 also provides overcompensation to account for the approximate delay through the digital delay circuit 230.

Feed-forward noise amplifier 500 operates as follows. Reference current generator 520 includes a P-channel current mirror formed by transistors 524 and 521 connected to an N-channel current mirror formed by transistors 522 and 523 on the N-channel side. Assuming the P- and N-channel transistors are sized the same, the circuit stabilizes when the current IR through transistors 521 and 522 equals the current through transistors 524 and 521. In this case, the voltage on the gate of transistor 525 also causes transistor 525 to conduct current $I_{REF}$. The circuit again balances when $I_{REF}$ is conducted by the parallel combination of transistor 540 and transistor 550. Transistors 540 and 550, however, are sized proportionately such that for a gain value x, transistor 550 conducts $x*I_{REF}$, and transistor 540 conducts current $(1-x)*I_{REF}$. The gates of transistors 540 and 550 are driven by different signals. The gate of transistor 550 is driven by the second terminal of capacitor 510, which varies with the high-frequency noise components of $V_{DDQ}$. However, the gate of transistor 540 is driven by the output of lowpass filter 530, which filters out the high frequency noise component. Thus, as $V_{DDQ}$ increases due to high frequency noise, transistor 550 becomes less conductive, and Vbp decreases.

In the exemplary embodiment, the width of transistors 521, 522, and 524 are the same, and the width of transistor 523 is made equal to four times the width of transistor 521. Therefore, the width of transistor 550 is equal to 4*the width of transistor 524, and the width of transistor 540 is equal to $(1-x)*$the width of transistor 524. $A_v$ is the feed-forward noise gain and is equal to:

$$A_v = 1 + \frac{W(550)}{W(540)} \quad [1]$$

Bias signal Vbp can thus be expressed as:

$$Vbp = Vbp\_dc + Av * Vsupply\_noise \quad [2]$$

Since Vsupply_noise is induced from the $V_{DDQ}$ supply, but Av*Vsupply_noise is applied to the gate of P-channel transistors, then if Av=1, the power supply noise would be canceled. However, there is additional variable delay through digital delay circuit 230 induced by power supply noise, and Av is advantageously made greater than 1 to overcompensate for the injected variation in delay by these additional digital circuits.

Figure 6:
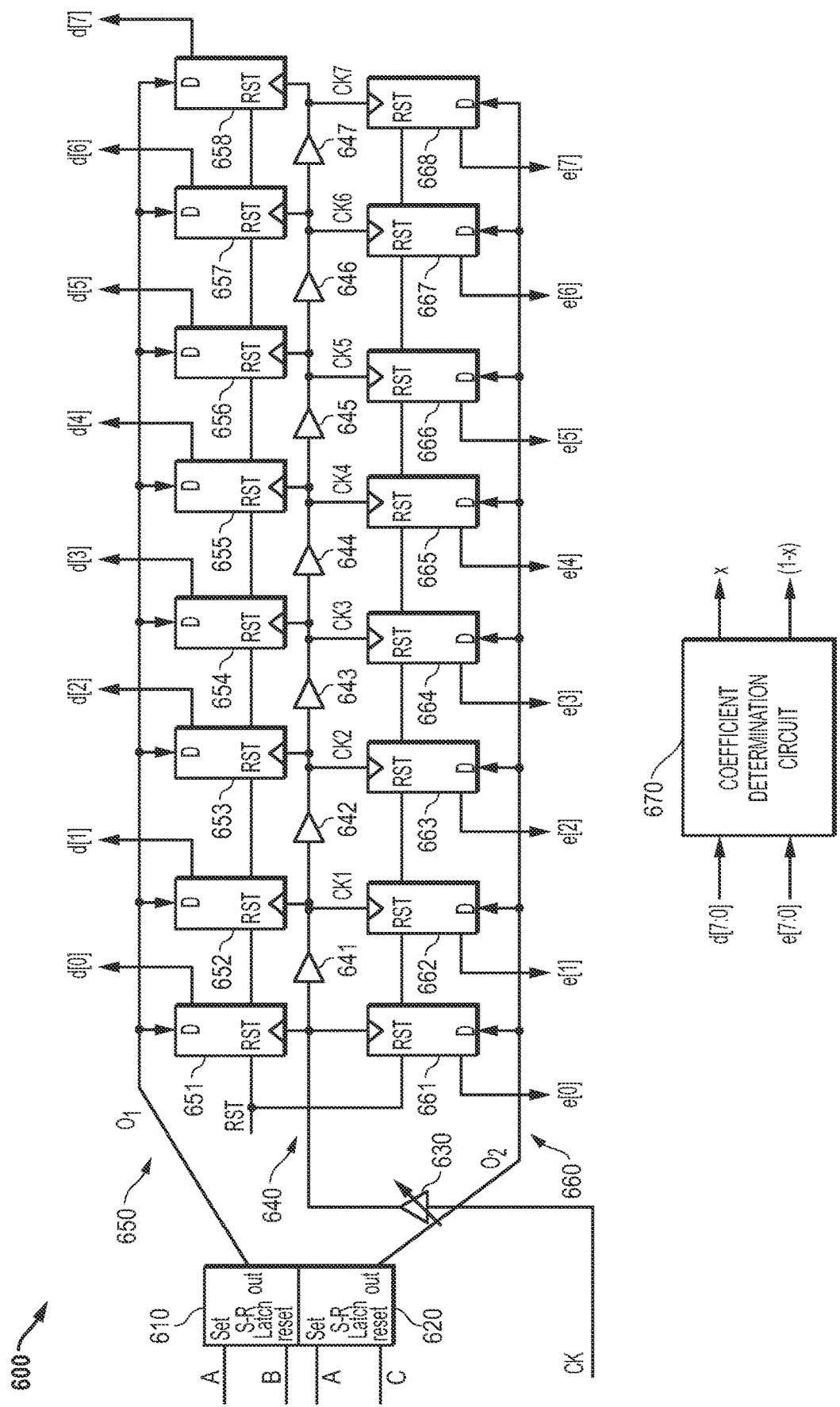
FIG. 6 illustrates in block diagram form a delay measurement circuit suitable for use with the feed-forward noise amplifier of FIG. 5 according to some embodiments.

FIG. 6 illustrates in block diagram form a delay measurement circuit 600 suitable for use with feed-forward noise amplifier 213 of FIG. 5 according to some embodiments. Delay measurement circuit 600 is used to set the amplification and determine the x and (1-x) values as will now be described.

Delay measurement circuit 600 includes an SR flip-flop 610, an SR flip-flop 620, a variable gain buffer 630, a delay path 640, a set of D latches 650 associated with SR flip-flop 610, a set of D latches 660 associated with SR flip-flop 620, and a coefficient determination circuit 670.

SR flip-flop 610 has a set input connected to the "A" node, a resent input connected to the "B" node, and an output for providing a signal labelled "$O_1$". SR flip-flop 620 has a set input connected to the "A" node, a resent input connected to the "C" node, and an output for providing a signal labelled "$O_2$". Variable gain buffer 630 has an input for receiving a clock signal labelled "CK", an output, and a gain control input.

Delay path 640 includes a set of buffers 641-647 that delay the output of variable gain buffer 630 to determine individual delays individual inverters 641-647 that generate clock signals that can be used to measure delays. Buffer 641 has an input connected to the output of variable gain buffer 630, and an output for providing a signal labelled "CK1". Buffer 642 has an input connected to the output of buffer 641, and an output for providing a signal labelled "CK2". This pattern repeats until buffer 647, that has an input connected to the output of buffer 646, and an output for providing clock signal CK7.

D latches 650 include D latches 651-658. D latch 651 has a reset input labelled "RST" for receiving a signal likewise labelled "RST", a clock input connected to the output of variable gain buffer 630, a D input for receiving the O1 signal, and an output for providing a signal labelled "d[0]". D latch 652 has a reset input for the RST signal, a clock input connected to the output of buffer 641, a D input for receiving the O1 signal, and an output for providing a signal labelled "d[1]". This pattern repeats until D latch 658, which has a reset input for the RST signal, a clock input connected to the output of buffer 647, a D input for receiving the O1 signal, and an output for providing a signal labelled "d[7]".

D latches 660 include D latches 661-668. D latch 661 has a reset input for receiving the RST signal, a clock input connected to the output of variable gain buffer 630, a D input for receiving the O2 signal, and an output for providing a signal labelled "e[0]". D latch 662 has a reset input for the RST signal, a clock input connected to the output of buffer 641, a D input for receiving the O2 signal, and an output for providing a signal labelled "e[1]". This pattern repeats until D latch 668, which has a reset input for the RST signal, a clock input connected to the output of buffer 647, a D input for receiving the O2 signal, and an output for providing a signal labelled "e[7]".

Coefficient determination circuit 670 has a first input for receiving the e[7:0] signals, a second input for receiving the input for receiving the e[7:0] signals, a first output for providing the value x, and a second output for providing the value (1-x).

As noted above, the feed forward noise amplification factor $$A_v\left(A_v = \frac{1}{x}\right)$$

is proportional to:

$$\frac{(\text{Total delay})ACdelay}{(\text{Analog delay})ABdelay} = \frac{1'\text{sine}[7:0]}{1'\text{sind}[7:0]} \quad [3]$$

By determining the ratio of the AC delay to the AB delay, coefficient determination circuit 670 can determine the values of x and (1−x) that compensate for PSIJ in DQS and DQS. Furthermore, the overcompensation ratios can be determined by a suitable technique such as one of those described above.

Figure 7:
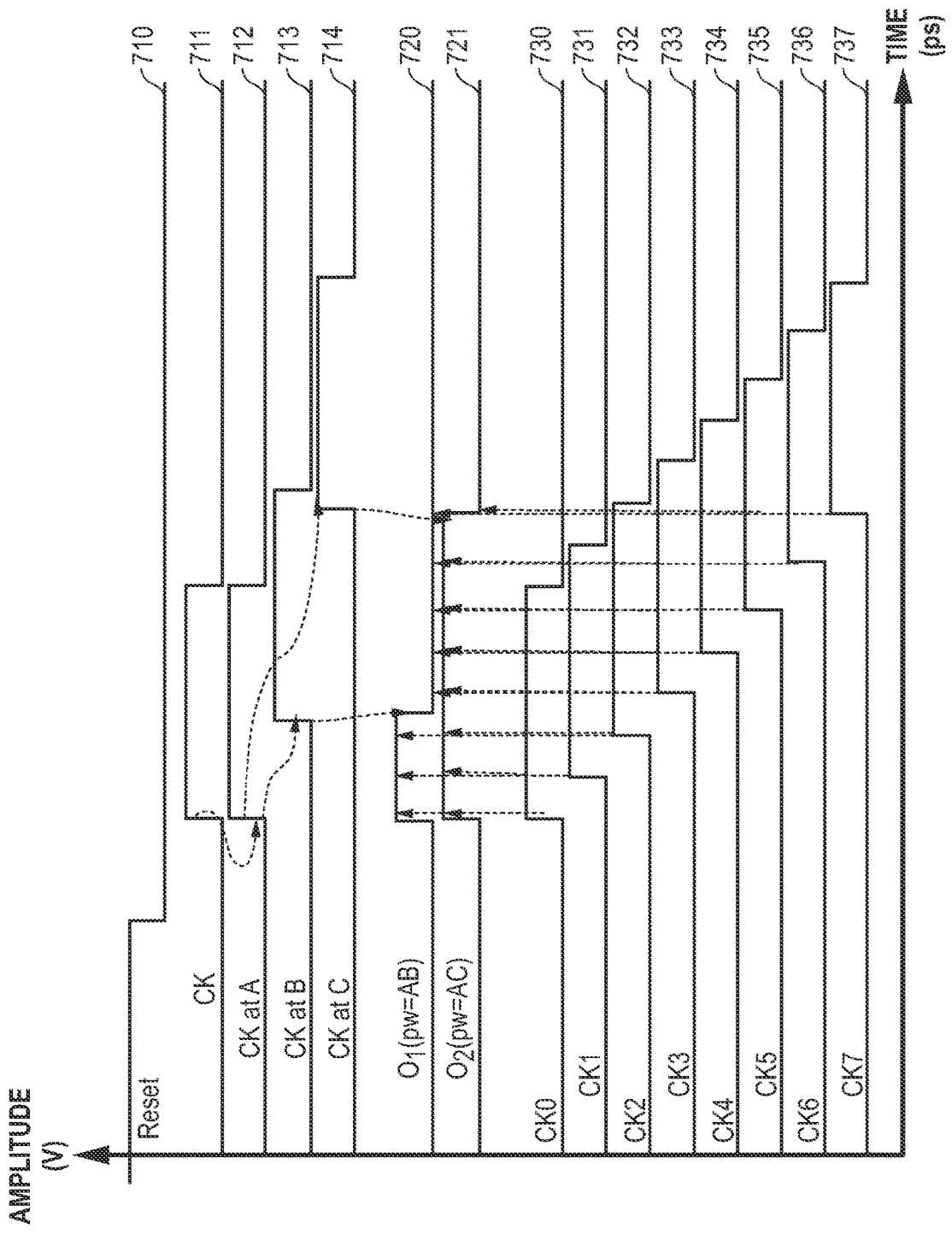
FIG. 7 illustrates a timing diagram useful in understanding the operation of the delay measurement circuit of FIG. 6.

FIG. 7 illustrates a timing diagram 700 useful in understanding the operation of the delay measurement circuit 600 of FIG. 6. In timing diagram 700, the horizontal axis represents time in picoseconds (ps), and the vertical axis represents the amplitude of various signals in volts. Shown in FIG. 7 are various waveforms of interest grouped into three groups.

A first waveform group includes waveforms 710-714. Waveform 710 shows a reset pulse labelled "RESET". Waveform 711 shows clock signal CK. Waveform 712 shows the CK signal at node A. Waveform 713 shows the CK signal at node B. Waveform 714 shows the CK signal at node C.

A second waveform group includes waveforms 720 and 721. Waveform 720 shows the $O_1$ signal, which represents the pulse width from the activation of the CK signal at node A until the activation of the CK signal at node B. Waveform 721 shows the $O_2$ signal, which represents the pulse width from the activation of the CK signal at node A until the activation of the CK signal at node C.

A third waveform group includes waveforms 730-737. Waveform 730 shows the CK0 signal at the output of variable gain buffer 630. Waveform 731 shows the CK1 signal at the output of buffer 631. Waveform 732 shows the CK1 signal at the output of buffer 632, and so on, until Waveform 737 shows the CK7 signal at the output of buffer 637.

The operation of delay measurement circuit 600 of FIG. 6 can now be described with reference to timing diagram 700. The pulse width of $O_1$ is proportional to delay between node A and node B, i.e., delay of analog components. $O_1$ is set by rising edge at the start point of delay (i.e., node A), and is reset by the rising edge at the endpoint of delay (i.e., node B). The pulse width of $O_2$ is proportional to delay between node A and node C (i.e., the total delay of the unmatched path). $O_2$ is set by rising edge at the start point of the delay (i.e., node A), and is reset by rising edge at the end point of the delay (i.e., at node C).

Signals d[7:0] and e[7:0] are generated by over-sampling $O_1$ and $O_2$, respectively, by the clock pulse with gradual delay increases. The number of ones in d[7:0] and e[7:0] are proportional to the delay through analog circuit 131 and the total delay to sampling circuit 133, respectively. Note that care should be taken during clock tree construction, to make sure clock arrival times across the SR latches that are used to generate d[7:0] and e[7:0] are matched tightly.

The delay through the digital delay circuit 132, therefore, is inherently measured and is equal to the time from the high-to-low edge of $O_1$ to the high-to-low edge of $O_2$. Coefficient determination circuit 670 then determines the values of x and (1−x) to overcompensate for the full delay from the unmatched path from node A to node C.

Thus, a signal processing circuit architecture that compensates for PSIJ has been described. The signal processing circuit uses feed-forward PSIJ compensation to avoid the long settling time of analog delay circuits. It compensates for the distortion caused by PSIJ by inducing a signal that "jitters" in the opposite direction to nullify the jitter through the uncompensated path. It nullifies jitter in the whole unmatched path by overcompensating the jitter transfer function of the analog circuit, e.g., the AFE, by amplifying the PSIJ noise to bias voltages used in the AFE. It determines the overcompensation ratio using a digital flip-flop bank. Determination of the required overcompensation ratio can be performed by a simple look-up table created by monitoring the power supply.

While particular embodiments have been described, various modifications to these embodiments will be apparent to those skilled in the art. For example, a receiver as shown and described herein can be used in a variety of signal processing circuits, such as source-synchronous data systems, including DDR, LPDDR, and GDDR DRAMs as well as other well-known systems. The technique was described in terms of exemplary circuits used in the analog front-end, but in other embodiments other suitable circuits can be used. Moreover, a variety of techniques can be used to determine a suitable overcompensation ratio.

Accordingly, it is intended by the appended claims to cover all modifications of the disclosed embodiments that fall within the scope of the disclosed embodiments.

What is claimed is:

1. A signal processing circuit, comprising:
an analog circuit for receiving a clock signal and providing a compensated clock signal; and
a digital delay circuit coupled to the analog circuit for providing a compensated sample clock signal in response to delaying the compensated clock signal,
wherein the analog circuit measures a variation of a power supply voltage and adjusts a gain through the analog circuit according to a measured variation of the power supply voltage.

2. The signal processing circuit of claim 1, further comprising:
a sampling circuit for sampling a data signal in response to an edge of the compensated sample clock signal.

3. The signal processing circuit of claim 1, wherein:
the analog circuit overcompensates an effect of the variation of the power supply voltage on jitter induced by the power supply voltage in the analog circuit.

4. The signal processing circuit of claim 3, wherein:
the analog circuit overcompensates the effect of the variation of the power supply voltage on the jitter induced by the power supply voltage in the analog circuit by selecting an amount proportional to the measured variation of the power supply voltage in response to both a delay through the analog circuit and a delay through the digital delay circuit.

5. The signal processing circuit of claim 1, wherein the analog circuit comprises:
an input stage having a power supply input for receiving the power supply voltage, a signal input for receiving the clock signal, a control input for receiving a gain adjustment signal, and an output; and
a feed-forward noise amplifier having a power supply input for receiving the power supply voltage, and an output for providing the gain adjustment signal in response to the measured variation of the power supply voltage.

6. The signal processing circuit of claim 5, wherein the feed-forward noise amplifier comprises:
a capacitor having a first terminal for receiving the power supply voltage, and a second terminal forming the compensated clock signal;
a reference current generator for forming a reference current based on a voltage on the second terminal of the capacitor;
a lowpass filter having an input coupled to the second terminal of the capacitor, and an output;

a first transconductance amplifier having an input coupled to the second terminal of the of the lowpass filter, and an output coupled to the second terminal of the capacitor; and a second transconductance amplifier having an input coupled to the second terminal of the capacitor, and an output coupled to the second terminal of the capacitor.

7. The signal processing circuit of claim 6, further comprising:

a delay measurement circuit, for measuring a first delay between the clock signal and the compensated sample clock signal, wherein the analog circuit sets respective gains of the first transconductance amplifier and the second transconductance amplifier in response to the first delay.

8. The signal processing circuit of claim 7, wherein:

the delay measurement circuit determines a second delay between the clock signal and the compensated clock signal, and a third delay between the clock signal and the compensated sample clock signal, and sets gains of the first transconductance amplifier and the second transconductance amplifier in response to a difference between the third delay and the second delay.

9. A data processing system comprising:

a data processor having a memory controller and a physical interface circuit coupled to the memory controller; and a memory coupled to the physical interface circuit over a memory bus, the memory bus conducting a data signal with a corresponding source-synchronous clock signal, wherein at least one of the physical interface circuit and the memory comprises a signal processing circuit, the signal processing circuit comprising:

an analog circuit for receiving a clock signal and providing a compensated clock signal; and a digital delay circuit coupled to the analog circuit for providing a compensated sample clock signal in response to delaying the compensated clock signal, wherein the analog circuit measures a variation of a power supply voltage and adjusts a gain through the analog circuit according to a measured variation of the power supply voltage.

10. The data processing system of claim 9, wherein:

the analog circuit overcompensates an effect of the variation of the power supply voltage on jitter induced by the power supply voltage in the analog circuit.

11. The data processing system of claim 10, wherein:

the analog circuit overcompensates the effect of the variation of the power supply voltage on the jitter induced by the power supply voltage in the analog circuit by selecting an amount proportional to the measured variation of the power supply voltage in response to both a delay through the analog circuit and a delay through the digital delay circuit.

12. The data processing system of claim 9, wherein the signal processing circuit further comprises:

a sampling circuit for sampling the data signal in response to an edge of the compensated sample clock signal.

13. The data processing system of claim 9, wherein the analog circuit comprises:

an input stage having a power supply input for receiving the power supply voltage, a signal input for receiving a clock signal, a control input for receiving a gain adjustment signal, and an output; and a feed-forward noise amplifier having a power supply input for receiving the power supply voltage, an input coupled to the output of the input stage, and an output for providing the compensated clock signal in response to the measured variation of the power supply voltage.

14. The data processing system of claim 13, wherein the feed-forward noise amplifier comprises:

a capacitor having a first terminal for receiving the power supply voltage, and a second terminal forming the compensated clock signal;

a reference current generator for forming a reference current based on a voltage on the second terminal of the capacitor;

a lowpass filter having an input coupled to the second terminal of the capacitor, and an output;

a first transconductance amplifier having an input coupled to the second terminal of the of the lowpass filter, and an output coupled to the second terminal of the capacitor; and a second transconductance amplifier having an input coupled to the second terminal of the capacitor, and an output coupled to the second terminal of the capacitor.

15. The data processing system of claim 14, further comprising:

a delay measurement circuit, for measuring a first delay between the clock signal and the compensated sample clock signal, wherein the analog circuit sets respective gains of the first transconductance amplifier and the second transconductance amplifier in response to the first delay.

16. The data processing system of claim 15, wherein:

the delay measurement circuit determines a second delay between the clock signal and the compensated clock signal, and a third delay between the clock signal and the compensated sample clock signal, and sets gains of the first transconductance amplifier and the second transconductance amplifier in response to a difference between the third delay and the second delay.

17. A method for compensation for power supply induced jitter of a clock signal of a signal processing circuit, comprising:

receiving the clock signal;

providing a compensated clock signal in response to receiving the clock signal by an analog circuit;

providing a compensated sample clock signal in response to delaying the compensated clock signal;

sampling a data signal in response to an edge of the compensated sample clock signal;

measuring a variation of a power supply voltage used by the signal processing circuit; and adjusting a gain used in providing the compensated sample clock signal in an amount proportional to a measured variation of the power supply voltage.

18. The method of claim 17, further comprising:

overcompensating an effect of the variation of the power supply voltage on jitter induced by the power supply voltage in the analog circuit.

19. The method of claim 18, wherein the overcompensating comprises:

selecting the amount proportional to the measured variation of the power supply voltage in response to both a delay through the analog circuit and a delay between the compensated clock signal and the compensated sample clock signal.

20. The method of claim 17, wherein providing the compensated sample clock signal comprises:

providing the compensated sample clock signal in response to delaying the compensated clock signal using a feed-forward noise amplifier having a power supply input for receiving the power supply voltage, and an output for providing the compensated clock signal in response to the variation of the power supply voltage.

\* \* \* \* \*